United States Patent [19]

Hamano et al.

[11] Patent Number: 5,506,542
[45] Date of Patent: *Apr. 9, 1996

[54] FILTER CIRCUIT AND FILTER INTEGRATED CIRCUIT

[75] Inventors: Hiroshi Hamano; Izumi Amemiya; Yoichi Oikawa; Takuji Yamamoto; Takeshi Ihara; Yoshinori Nishizawa, all of Kawasaki, Japan

[73] Assignee: Fujitsu Limited, Kanagawa, Japan

[ * ] Notice: The portion of the term of this patent shall not extend beyond the expiration date of Pat. No. 5,293,087.

[21] Appl. No.: 152,838

[22] Filed: Nov. 12, 1993

Related U.S. Application Data

[63] Continuation of Ser. No. 963,574, Oct. 19, 1992, Pat. No. 5,293,087.

[30] Foreign Application Priority Data

Oct. 17, 1991 [JP] Japan ..................... 3-269772

[51] Int. Cl.$^6$ ................................................. H03K 5/01
[52] U.S. Cl. ......................................... 327/558; 327/552
[58] Field of Search ..................... 330/306, 294, 330/107, 109; 307/520, 521; 328/127, 128, 167; 333/167, 172, 177; 327/552, 558, 559

[56] References Cited

U.S. PATENT DOCUMENTS

| | | | |
|---|---|---|---|
| 3,701,033 | 10/1972 | White | 330/306 |
| 4,855,627 | 8/1989 | Hitomi | 307/520 |
| 4,877,979 | 10/1989 | Sempel | 330/294 |
| 5,130,579 | 7/1992 | Thomas | 307/520 |
| 5,293,087 | 3/1994 | Hamono et al. | 307/520 |

FOREIGN PATENT DOCUMENTS 0292006  12/1987  Japan ..................... 330/294

*Primary Examiner*—Toan Tran

[57] ABSTRACT

A filter circuit and a filter integrated circuit capable of being used in a high frequency band includes a first resistor $R_1$ connected between an input signal source and an emitter of a common-base transistor $TR_1$, a first capacitor $C_1$ connected between said input signal source and a reference voltage point, a second capacitor $C_2$ connected between said input signal source and a collector of the common-base transistor $TR_1$, and a second resistor $R_2$ connected between the collector of the common-base transistor and the reference voltage point. Thus, a low-pass filter which operates in a high frequency band and suppresses the influence of characteristic parameters over the filter characteristic can be constructed.

23 Claims, 21 Drawing Sheets

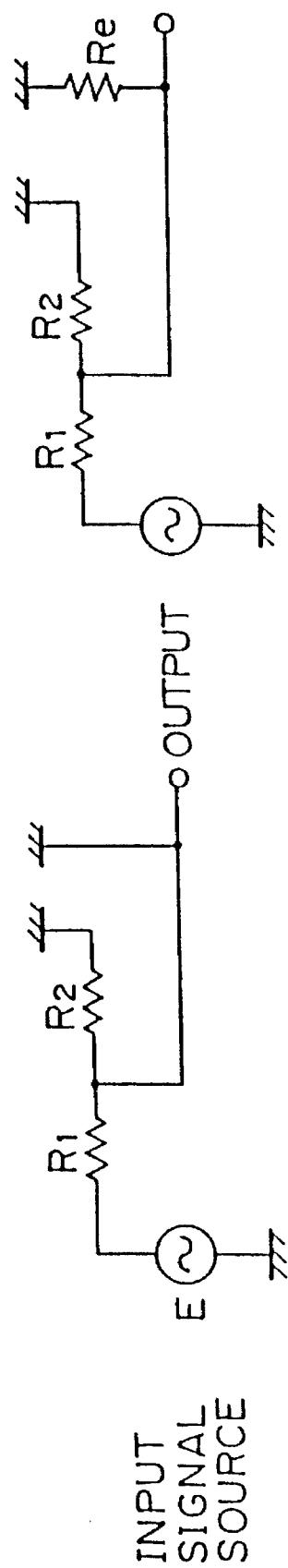
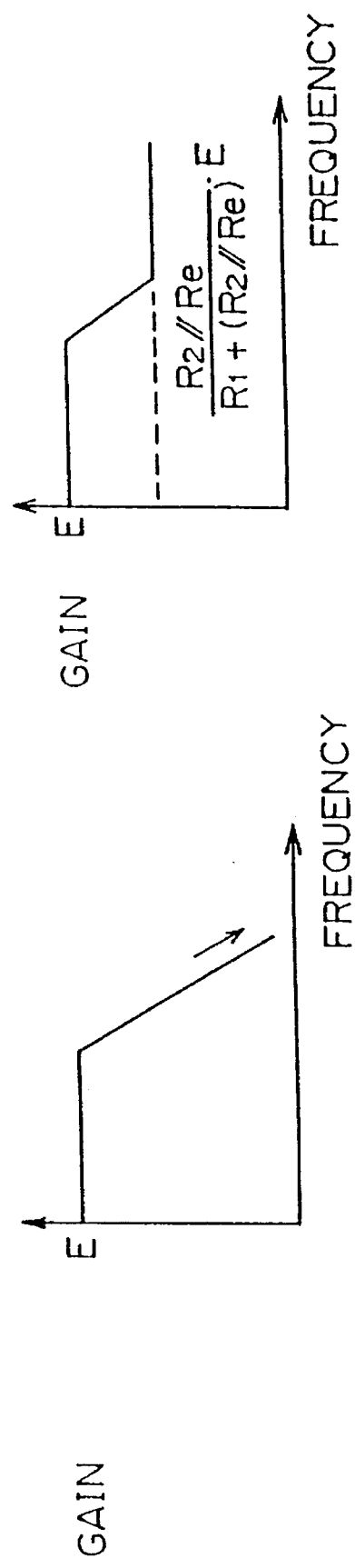
PRIOR ART
Fig. 8B
PRIOR ART
Fig. 8A

FILTER CIRCUIT AND FILTER INTEGRATED CIRCUIT

This is a continuation of application Ser. No. 963,574, filed Oct. 19, 1992, now U.S. Pat. No. 5,293,087.

BACKGROUND OF THE INVENTION

1. Field of the Invention

The present invention relates to a filter circuit using a transistor, and a filter integrated circuit formed on an integrated circuit.

2. Description of the Related Art

In an optical communication system or a radio communication system using high speed signals of several gigabits per seconds [Gb/s] or higher, high-pass, low-pass, and band-pass filters which operate in a high frequency band of several gigahertz [GHz] or higher are sometimes required. For example, in a timing circuit limiter amplifier for a 3R type optical repeater, a band-pass amplifier or the like using a tuning circuit and so forth is employed so as to suppress jitter caused by circuit noise and to prevent an output waveform from being linked by harmonics.

Generally, a filter circuit requires inductance as well as resistors and capacitors. However, it is difficult to form inductance in an integrated circuit (IC) device. Thus, a filter circuit is constructed by connecting an external coil. Alternatively, the entire filter circuit is used as an external part.

However, when inductance is provided as an external part, as the-frequency increases, stray capacitance, stray inductance, and so forth increase. As a result, the characteristic of the filter in a high frequency band thereof degrades.

To solve this problem, a filter is constructed of an operational (OP) amplifier, capacitors, and resistors which can be used for an IC device. This type of filter is referred to as an active filter.

FIGS. 1A and 1B are schematic diagrams showing bridge T type circuits. FIG. 2 is a schematic diagram showing a circuit of a band-pass filter which is constructed of a bridge T type circuit and an OP amplifier.

FIG. 3 is a schematic diagram showing a circuit of an active high-pass filter using an OP amplifier. FIG. 4 is a schematic diagram showing a circuit of an active low-pass filter referred to as a Sallen-Key circuit.

In the above-mentioned active filter using an OP amplifier, since the characteristic of the filter depends on the frequency characteristic of the OP amplifier, the filter can operate at up to several megahertz [MHz] rather than in a high frequency band of several gigahertz [GHz] or higher.

To solve this problem, a conventional wide-band amplifier instead of the OP amplifier can be used. However, even with a wide-band amplifier, since the phase characteristic in the high frequency band varies, a desired filter characteristic may not be obtained or an oscillation lay take place.

As shown in FIGS. 3 and 4, an active filter using a voltage follower which is constructed of an emitter follower circuit of a transistor can provide a wide-band filter although it cannot be applied to the band-pass filter using a negative feedback circuit of an OP amplifier as shown in FIG. 2.

FIGS. 5 and 6 are schematic diagrams showing circuits of a high-pass filter and a low-pass filter, each of which uses an emitter follower. In these filters, the OP amplifiers shown in FIGS. 3 and 4 are substituted with emitter follower circuits which are constructed of transistors.

However, in the Sallen-Key low-pass filter using the emitter follower shown in FIG. 6, when the filter operates in a high frequency band of gigahertz [GHz] or higher, a designed filter characteristic cannot be obtained due to the influence of the capacitance and resistance of the transistor.

Next, the influence of resistance, capacitance, and so forth of a transistor over a Sallen-Key low-pass filter using an emitter follower circuit shown in FIG. 6 will be described.

FIG. 7 is a schematic diagram showing an equivalent circuit, when operating in a high frequency band, of the Sallen-Key low-pass filter using the emitter follower circuit shown in FIG. 6. As shown in the FIG. 7, a base resistance $R_b$, an emitter resistance $R_e$, a base-collector capacitance $C_{bc}$, and so forth of the transistor are added to the low-pass filter shown in FIG. 6. Thus, in the circuit shown in FIG. 7, the low-pass filter which consists of $R_1$, $R_2$, $C_1$, and $C_2$ is connected to the low-pass filter which consists of $R_b$ and $C_{bc}$ in series. As a result, when the frequency band of the filter which consists of $R_1$, $R_2$, $C_1$, and $C_2$ is much lower than that of the filter which consists of $R_b$ and $C_{bc}$, a desired frequency characteristic can be obtained. However, when a low-pass filter which operates in a much higher frequency band is required, the frequency characteristic of the filter which consists of $R_b$ and $C_{bc}$ cannot be ignored.

Moreover, in a high frequency band, since the emitter resistance $R_e$ influences the output impedance of the emitter follower circuit, the low impedance intrinsic to the emitter follower circuit cannot be obtained.

FIG. 8A and 8B are schematic diagrams and graphs showing equivalent circuits and gains in a high frequency band (in the vicinity of the cutoff frequency) of a Sallen-Key low-pass filter. FIG. 8A shows an equivalent circuit and a gain in the ideal case where the filter is not affected by the parameters of the transistor. FIG. 8B shows an equivalent circuit and a gain in the case where the filter is affected by the emitter resistance $R_e$ of the transistor. In the equivalent circuits of FIG. 8, in the high frequency band, it is assumed that the capacitor of the filter is shorted.

At the cutoff frequency or high of the filter, the ideal low-pass filter shown in FIG. 8A has a particular attenuating characteristic. On the other hand, in the case where the influence of the emitter resistor $R_e$ of the transistor cannot be ignored as shown in FIG. 8B, at the cutoff frequency or higher of the filter, the gain of the filter is larger than a particular value. Thus, in this case, the filter does not have the characteristic of a low-pass filter.

FIG. 9 is a graph showing the frequency characteristic of the conventional low-pass filter using the emitter follower of FIG. 6. The solid line of the graph represents calculated values of an ideal characteristic. The dot line of the graph represents a simulated result using real transistor parameters.

As shown in FIG. 9, at around six gigahertz [6 GHz] before which is lower than the cutoff frequency, the output of the filter temporarily drops due to the influence of the base-collector capacitance $C_{bc}$ and the base resistance $R_b$ of the transistor. Thereafter, the stopping characteristic of the filter in the cutoff region degrades due to the influence of the emitter resistance $R_e$ of the transistor. As a result, a low-pass filter using an emitter follower cannot be used in a high frequency band of several gigahertz [GHz] or higher.

In addition, a circuit has been necessarily integrated in considerations of cost and reliability. In particular, the shorter the wavelength of a signal in a high frequency band, the more the analysis of a distributed constant of the circuit becomes important. Thus, the filter should be formed on an IC device.

When a filter is formed on an IC device, the frequency characteristic of the filter should be variably controlled so as to change the frequency band thereof and to compensate for the characteristic deviation which takes place in the production stage from device to device.

As a related art which can solve the above-mentioned problem, for example Japanese Patent Laid-Open Ser. No. 1984-215111 is known, which discloses a technology of adjusting a filter characteristic by changing a resistance of a diode after replacing a resistor used in a Sallen-Key type filter by the diode so as to adjust the operating characteristic of the filter.

However, it is likely that the object of the above-mentioned related art is to adjust the characteristic of the Sallen-Key low-pass filter rather than adjust the frequency characteristic of a filter which can operate in a high frequency band of several gigahertz [GHz] or higher.

SUMMARY OF THE INVENTION

An object of the present invention is to provide a filter circuit and a filter integrated circuit. Another object of the present invention is to provide a filter circuit and a filter integrated circuit which can control a frequency characteristic in a high frequency band thereof.

The first aspect of the present invention is a first resistor $R_1$ connected between an input signal source and an emitter of a common-base transistor $TR_1$, a first capacitor $C_1$ connected between the input signal source and a reference voltage point, a second capacitor $C_2$ connected between the input signal source and a collector of the common-base transistor $TR_1$, and a second resistor $R_2$ connected between the collector of the common-base transistor and the reference voltage point.

The second aspect of the present invention is a first capacitor $C_3$ and a second capacitor $C_4$ connected in series between an input signal source and a base of an emitter follower transistor $TR_5$, a first diode $D_3$ connected between the base of the emitter follower transistor $TR_5$ and a reference voltage point, a second diode $D_4$ connected between an emitter of the emitter follower transistor $TR_5$ and the connection point of the first and second capacitors $C_3$ and $C_4$, a first variable current source $I_2$ connected between a cathode of the first diode and the reference voltage point, and a second variable current source $I_3$ connected between a cathode of the second diode and the reference voltage point.

The current transfer characteristic of the input and output of the above-mentioned low-pass filter can be given by the following formula.

$$I_{out}/I_{in}=(1+sR_1C_1)/[s^2C_1R_1C_2\ R_2+sR_1\ (C_1+C_2)+1]$$

At this point, the polar angular frequency $\omega$ is given by the following formula.

$$\omega=(C_1R_1C_2R_2)^{-1/2}$$

Thus, when the relation of $R_2 > R_1$ and $C_1 \approx C_2$ are satisfied, nearly at the pole, the numerator of the above formula can be treated as "1". As a result, the formula represents the characteristic of a low-pass filter.

When a low-pass filter is constructed using a common-base transistor, the variation of the input voltage of the transistor can be decreased and the influence of the capacitance over the transistor can be suppressed. As a result, a filter which can satisfactorily operate in a high frequency band can be constructed.

Moreover, in the above-mentioned high-pass filter, by varying the output current of the variable current sources $I_1$ and $I_2$, the resistance of the diodes $D_3$ and $D_4$ can be controlled. As a result, the frequency characteristic of the filter can be freely adjusted.

Thus, when the filter is formed in an IC, the frequency band can be varied depending on its application and the characteristic deviation which is caused in the production stage of the IC from device to device can be compensated for.

These and other objects, features and advantages of the present invention will become more apparent in light of the following detailed description of a best mode embodiment thereof, as illustrated in the accompanying drawings.

BRIEF DESCRIPTION OF DRAWINGS

FIGS. 8A and 8B are schematic diagrams and graphs describing conventional low-pass filters;

DESCRIPTION OF PREFERRED EMBODIMENTS

Figure 10:
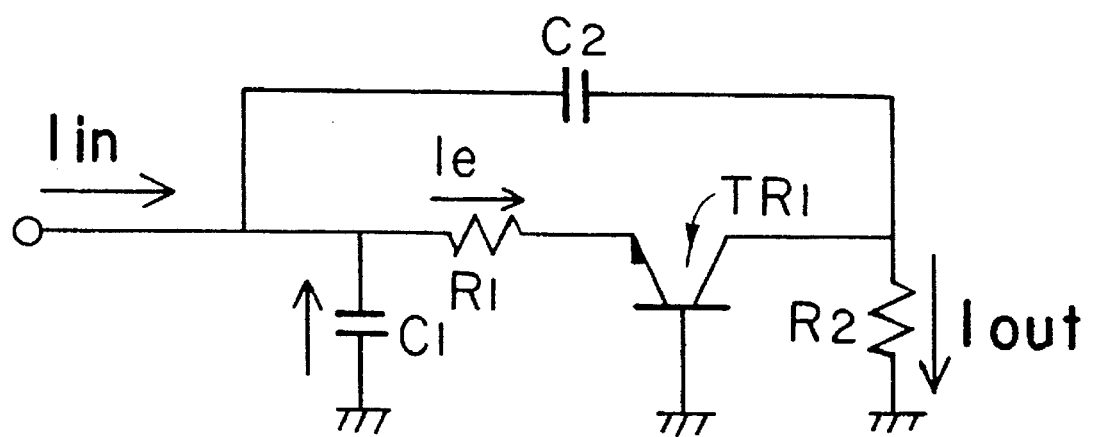
FIG. 10 is a schematic diagram showing a circuit of a low-pass filter of a first embodiment in accordance with the present invention.

Next, with reference to the accompanying drawings, embodiments in accordance with the present invention will be described. FIG. 10 is a schematic diagram showing a circuit of an active low-pass filter of a first embodiment in accordance with the present invention.

In FIG. 10, a resistor $R_1$ is connected between an input signal source and the emitter of a common-base transistor $TR_1$. A capacitor $C_1$ is connected between the input signal source and a ground plane (reference voltage point). A capacitor $C_2$ is connected between the collector of the transistor $TR_1$ and the input signal source. A resistor $R_2$ is connected between the collector of the transistor $TR_1$ and the ground surface.

In this circuit, a signal current which is received from the signal source is denoted by $I_{in}$; an output current which flows in the resister $R_2$ by $I_{out}$, a voltage of the capacitor $C_1$ by $V_{in}$; and an emitter current which flows in the resistor $R_1$ by $I_e$.

Since the emitter current $I_e$ of the common-base transistor $TR_1$ is nearly equal to the collector current, a current $I_{c2}$ which flows in the capacitor $C_2$ can be expressed by the following formulas.

$$I_{c2}=I_{out}-I_e \text{ and}$$

$$I_{c2}=I_{in}-(I_e+j\omega C_1 V_{in})$$

Thus, $I_{out}-I_e=I_{in}-(i_e+j\omega C_1 V_{in})$

Therefore, the following formula can be obtained.

$$V_{in}=(I_{in}-I_{out})/j\omega C_1 \quad (1)$$

Since the voltage $V_{in}$ of the capacitor $C_1$ is given by the following formula $$V_{in}=(I_{out}-I_e)/j\omega C_2+R_2 I_{out}$$

Thus, $I_{out}-I_e=(V_{in}-R_2 I_{out})j\omega C_2$

By substituting $I_e=V_{in}/R_1$ into the above formula, the following formula can be obtained.

$$I_{out}-V_{in}/R_1=(V_{in}-R_2 I_{out})j\omega C_2 \quad (2)$$

By substituting the formula (1) into the formula (2), $$I_{out}-(I_{in}-I_{out})/j\omega C_1 R_1=[(I_{in}-I_{out})/j\omega\, C_1-R_2 I_{out}]j\omega C_2$$

By arranging the above formula, the following formula can be obtained.

$$j\omega C_1 R_1 I_{out}-(I_{in}-I_{out})=j\omega C_2 R_1 (I_{in}-I_{out})- j\omega C_1 R_1 j\omega C_2 R_2 I_{out}$$

In addition, $$(j\omega C_1 R_1 j\omega C_2 R_2+j\omega C_1 R_1+j\omega C_2 R_1+1)I_{out}= (1+j\omega C_2 R_1)\,I_{in}$$

Thus, the current transfer characteristic of the input and output can be given by the following formula.

$$I_{out}/I_{in}=(1+j\omega C_2 R_1)/[\,(j\omega)^2 C_1 R_1 C_2 R_2+j\omega R_1(C_1+C_2)+1] \quad (3)$$

Moreover, the above formula can be expressed with a complex angular frequency s.

$$I_{out}/I_{in}=(1+sR_1C_2)/[s^2 C_1 R_1 C_2 R_2+sR_1\,(C_1+C_2)+1] \quad (4)$$

At this point, the polar angular frequency and Q of the filter can be given by the following formulas.

$$\omega=(C_1 R_1 C_2 R_2)^{-1/2}$$

$$Q=(R_2/R_1)^{1/2}\cdot(C_1 C_2)^{1/2}/(C_1+C_2)$$

Although the formula (4) is precisely not a transfer characteristic formula of a low-pass filter, when the relations of $R_2>R_1$ and $C_1\approx C_2$ are satisfied so as to increase the value of Q, $sR_1C_2$ of the numerator of the formula (4) nearly at the polar frequency can be transformed into $R_1C_2/(C_1R_1C_2R_2)^{1/2}$. Thus, when the relations of $R_2=nR_1$ and $C_1\approx C_2$ are satisfied, the relation of $sR_1C_2\approx (n)^{-1/2}$ is obtained. Thus, the numerator of the formula (4) can be treated as nearly "1".

In other words, the formula (4) represents the transfer characteristic of a low-pass filter. Thus, a low-pass filter can be constructed using a common-base transistor.

Figure 11:
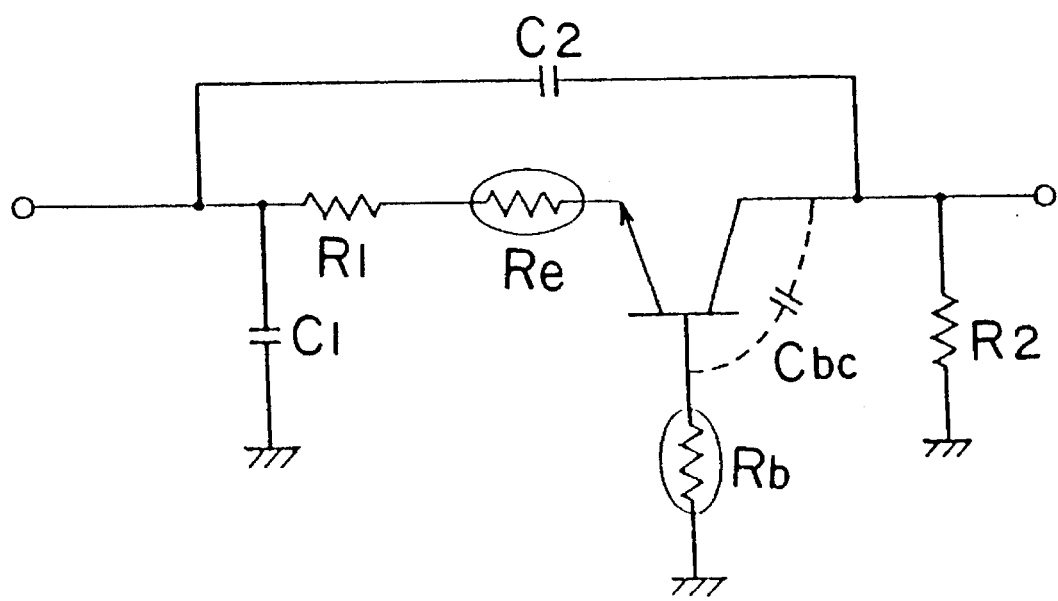
FIG. 11 is a schematic diagram showing an equivalent circuit of the low-pass filter of the first embodiment.

FIG. 11 shows an equivalent circuit, when operating in a high frequency band, of a low-pass filter using a common-base transistor. In this equivalent circuit, the emitter resistance $R_e$ of the transistor is connected to the resistor $R_1$ of the filter in series. Thus, when a particular value of the resistor $R_1$ is selected, a desired characteristic of the filter can be obtained. In the common-base transistor, the base resistance $R_b$ and the base-collector capacitance $C_{bc}$ are connected to the resistor $R_2$ in parallel. Thus, when the value of the resistor $R_2$ is large, the impedance formed by the base-resistance $R_b$ and the base-collector capacitance $C_{bc}$ affects the characteristic of the filter. However, when a low-pass filter is used in a high frequency band, since a small value is assigned to the resistor $R_2$, it is possible to prevent the base resistance $R_b$ and the base-collector capacitance $C_{bc}$ from affecting the characteristic of the filter.

Here, exemplary values of $C_1$, $C_2$, $R_1$ and $R_2$ are shown. The values of capacitors $C_1$ and $C_2$ are must be more than a minimum to shut an effect of the internal capacitance of a transistor. If the capacitors $C_1$ and $C_2$ have capacitance values approximately at zero point five picofarads [0.5 pF], the values of resistors $R_1$ and $R_2$ of a low-pass filter having a cutoff frequency of ten gigahertz [10 GHz] are about ten ohms [10 $\Omega$] and twenty ohms [20 $\Omega$], for example. That is, $$R_1=10\ \Omega \text{ and } R_2 20\ \Omega,\text{ when } C_1=C_2=0.5\text{ pF.}$$

When the value of $R_2$ is like the above, the composite impedance of the transistor due to the base-collector capacitance $C_{bc}$ and the base resistance $R_b$ has little effect in a high frequency band over a few gigahertz [GHz].

In other words, when a low-pass filter is constructed by using a common-base transistor, the filter can operate in a high frequency band of several gigahertz [GHz] or higher and suppress the influence of the inner resistance and capacitance thereof over the frequency characteristic.

Next, with reference to FIG. 12, a low-pass filter of a second embodiment in accordance with the present invention will be described. In the low-pass filter shown in FIG. 12, an emitter follower circuit is connected to an output of the common-base transistor shown in FIG. 10 so as to obtain an output signal as a voltage signal.

Figure 12:
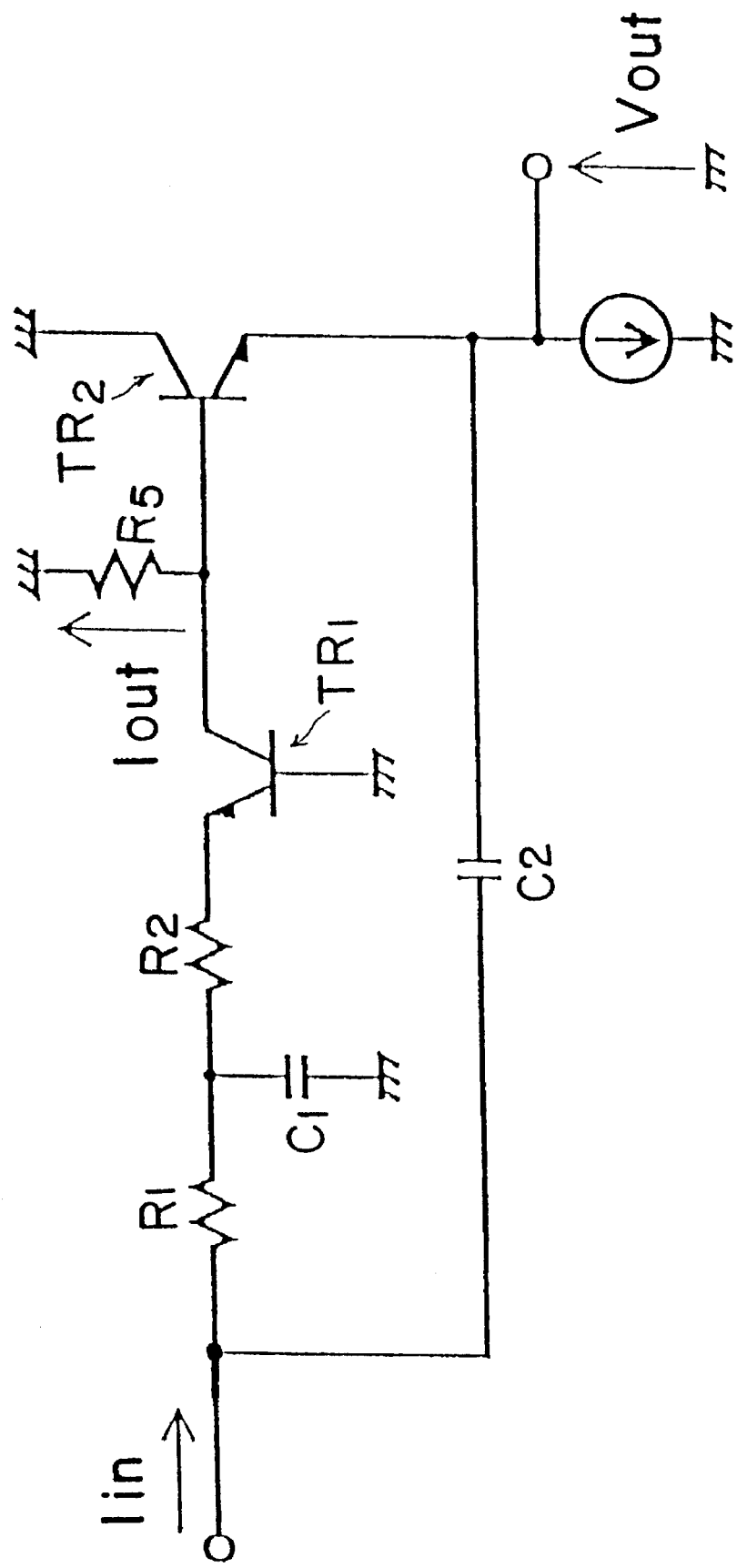
FIG. 12 is a schematic diagram showing a circuit of a low-pass filter of a second embodiment.

In the circuit shown in FIG. 12, a resistor $R_5$ is connected between the collector of a common-base transistor $TR_1$ and a ground surface. The collector of the common-base transistor $TR_1$ is connected to the base of an emitter follower transistor $TR_2$.

The transfer characteristic of the input and output of this filter circuit can be given by the following formula.

$$V_{out}/I_{IN}=R_5/[s^2 C_1 R_1 C_2 R_2+s\,(C_1 R_1+C_2 R_1+C_2 R_2-C_2 R_5)+1]$$

In addition, the polar angular frequency $\omega$ and Q of the filter of this circuit can be given by the following formulas.

$$\omega = (C_1 R_1 C_2 R_2)^{-1/2}$$

$$Q = (C_1 R_1 C_2 R_2)^{-1/2}/(C_1 R_1 + C_2 R_1 + C_2 R_2 - C_2 R_5)$$

When the values of $C_2$ and $R_5$ are set in such a way that the relation of $C_2 R_5 = C_1 R_1 + C_2 R_1 + C_2 R_2$ is satisfied, the transfer characteristic of the filter can be given by the following formula.

$$V_{out}/I_{IN} = R_5/[s^2 C_1 R_1 C_2 R_2 + 1]$$

This formula represents the transfer characteristic of the filter with a resonant frequency of $\omega = 1/(C_1 R_1 C_2 R_2)^{-1/2}$. Thus, when the above-mentioned value of $C_2 R_5$ is set, the filter of FIG. 12 can be used as a band-pass filter.

Figure 13:
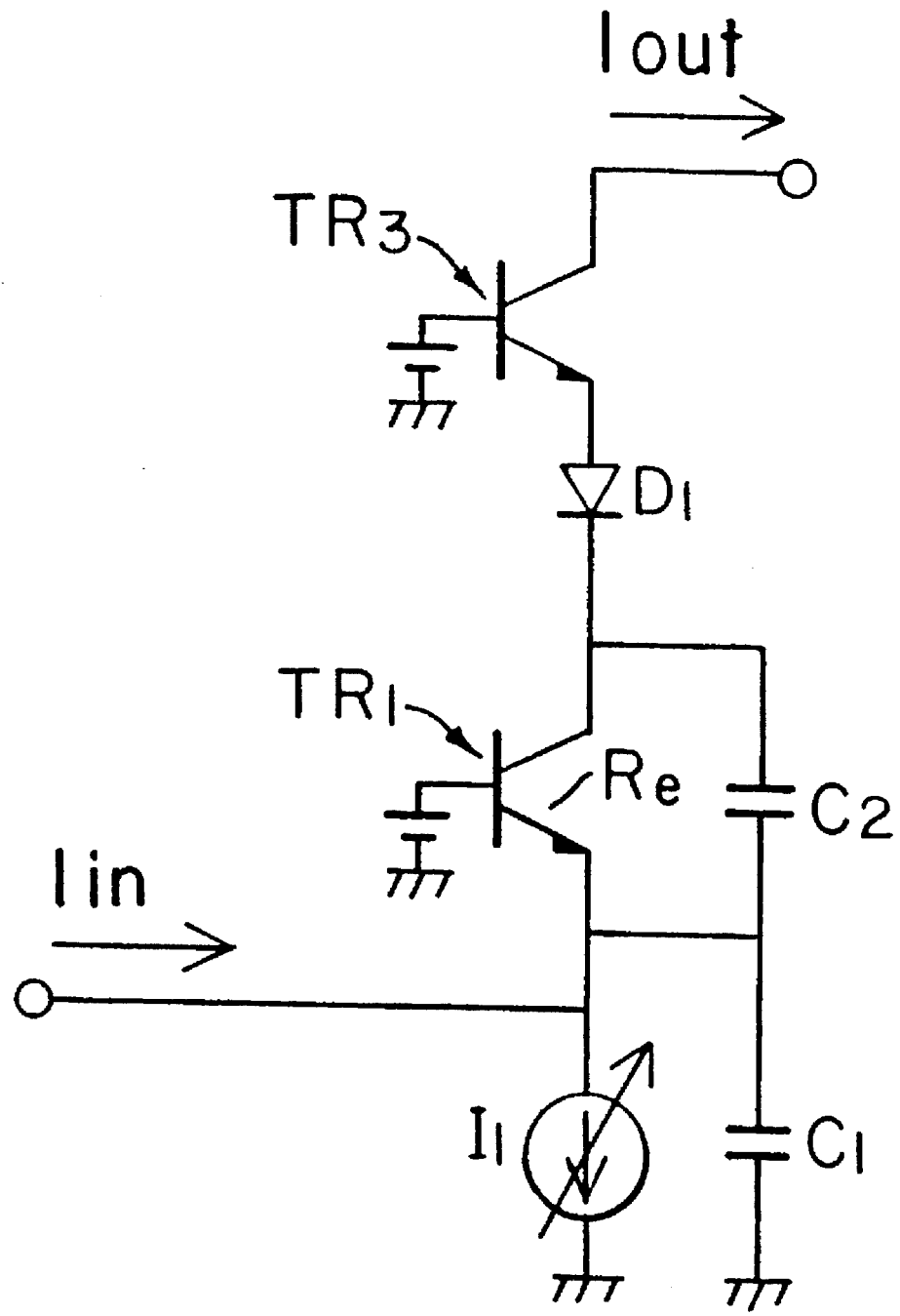
FIG. 13 is a schematic diagram showing a circuit of a low-pass filter of a third embodiment.
Figure 13A:
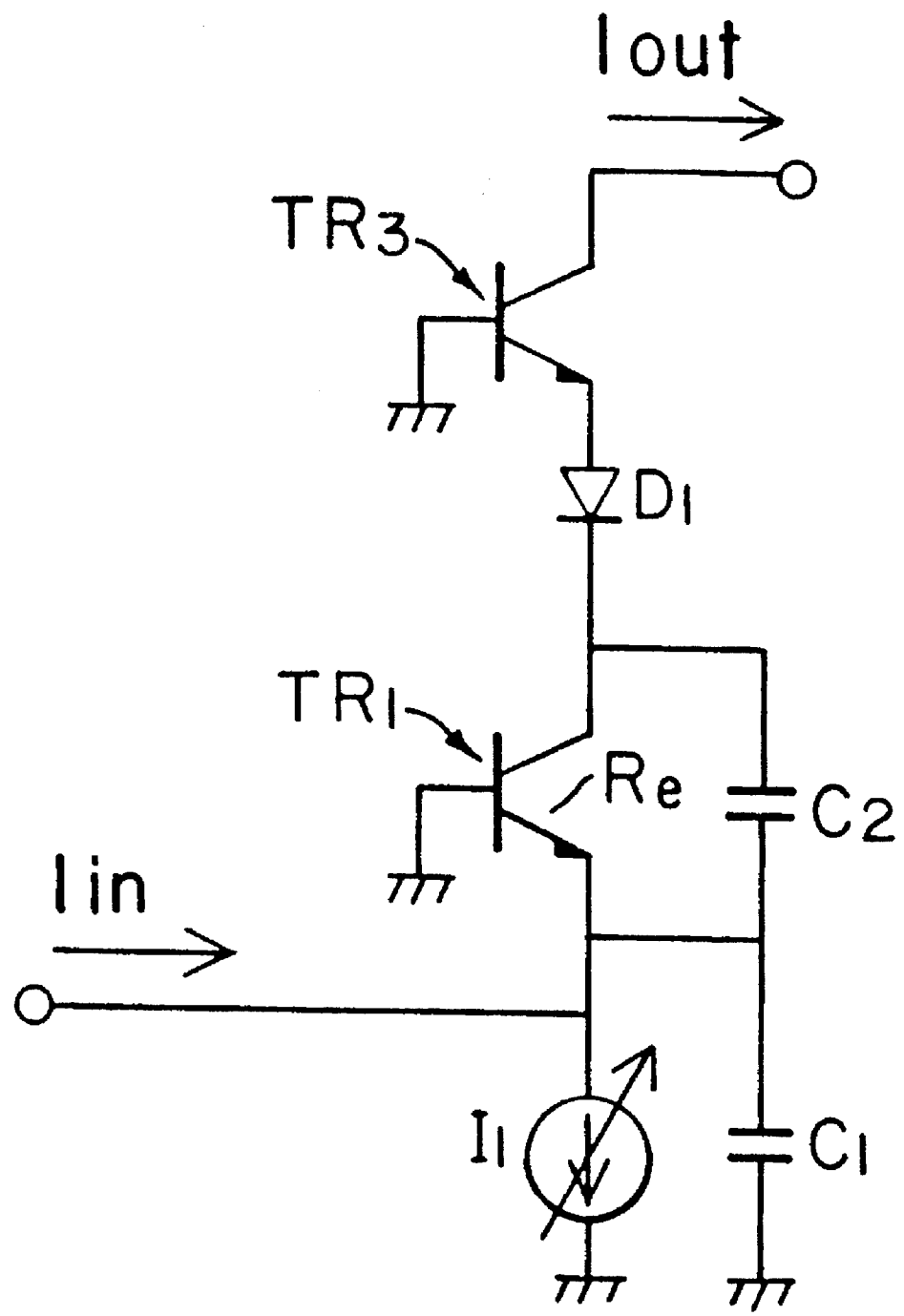
FIG. 13a is a schematic diagram showing a circuit of a low-pass filter of FIG. 13 with the grounded-base transistors of the embodiment of FIG. 10.

Next, with reference to FIG. 13, an active low-pass filter of a third embodiment in accordance with the present invention will be described. The active low-pass filter shown in FIG. 13 is constructed by using common-base transistors. In this active low-pass filter, the frequency characteristic can be controlled.

In the circuit shown in FIG. 13, an emitter resistance $R_e$ of a first common-base transistor is used instead of the resistor $R_1$ of FIG. 10. In addition, an emitter resistance of a second common-base transistor and the resistance of a diode $D_1$ which are connected in series are used instead of the resistance $R_2$ of FIG. 10. The anode of the diode $D_1$ is connected to the emitter of the second common-base transistor $TR_3$. From the collector of the second common-base transistor, a signal current is obtained.

In addition, a variable current source $I_1$ which is used to control the values of the resistance of the emitter resistance $R_e$ and the diode $D_1$ is connected between the emitter of the common-base transistor $TR_1$ and the ground surface.

In this low-pass filter, by varying the output current of the variable current source $I_1$, the values of the resistance of the emitter resistance $R_e$ and the diode $D_1$ can be varied so as to control the cutoff frequency. As a result, since the cutoff frequency of the filter can be varied in a predetermined range, a desired frequency characteristic thereof can be obtained. In addition, the characteristic deviation of the filter which is caused in the production stage of the IC from device to device can be compensated.

Figure 14:
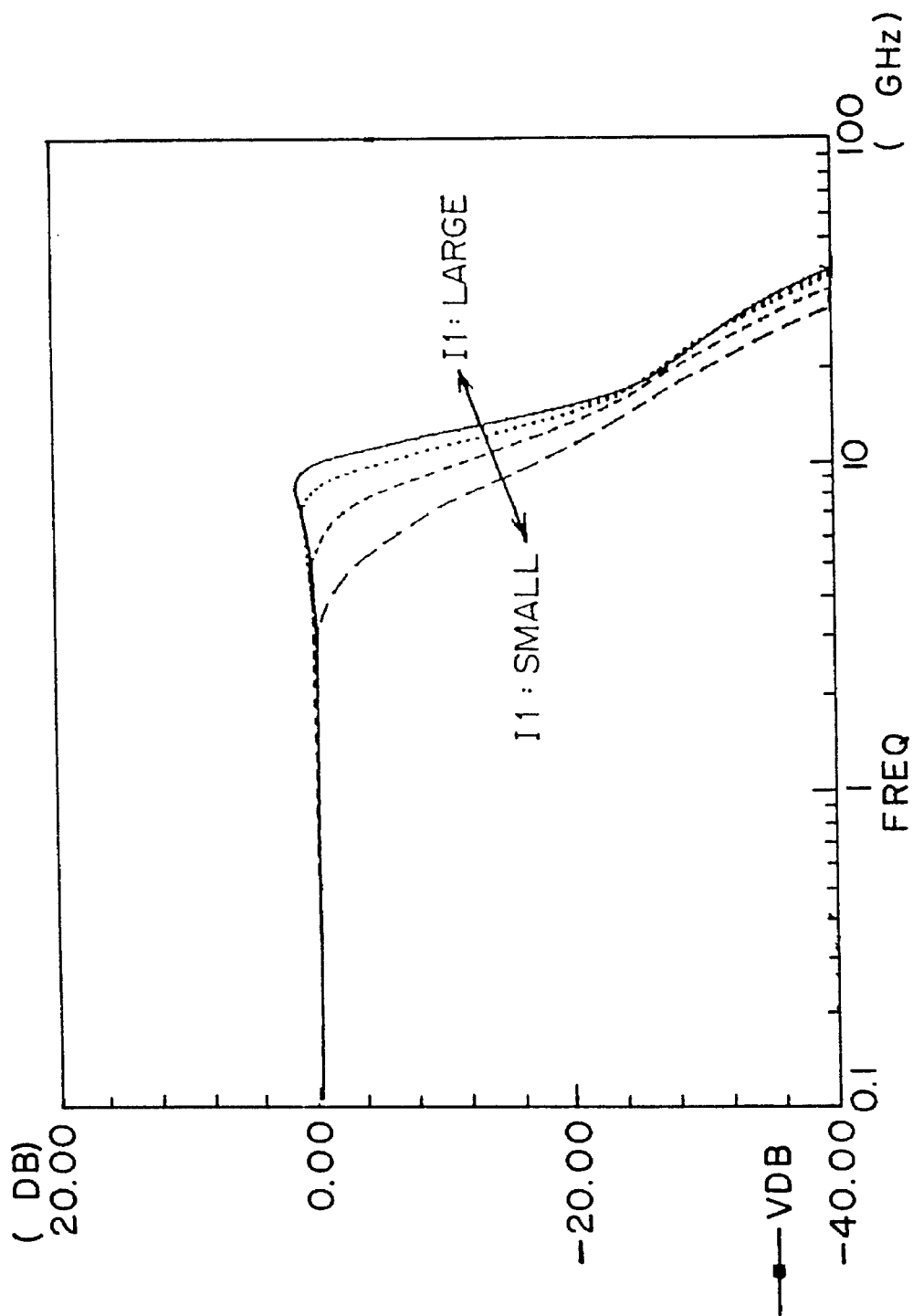
FIG. 14 is a graph showing the frequency characteristic of the low-pass filter of the third embodiment.

FIG. 14 is a graph showing an example of the frequency characteristic of the above-mentioned low-pass filter. In the graph, the output of the filter slightly increases due to the influence of the characteristic of the transistor in the vicinity of the cutoff frequency of ten gigahertz [10 GHz]. However, in a high frequency band of several gigahertz [GHz] or higher, a nearly desired frequency characteristic can be obtained.

The four dot lines of the graph represent cutoff characteristics of the filter where the output current of the variable current source $I_1$ is varied. Thus, this graph shows that by varying the output current of the variable current source $I_1$ the cutoff frequency of the filter can be controlled.

Next, with reference to FIG. 15, a band-pass filter of a fourth embodiment in accordance with the present invention will be described. In the band-pass filter shown in the figure, a high-pass filter HP using an emitter follower circuit and the low-pass filter LP using a common-base transistor shown in FIG. 13 are combined.

Figure 1A:
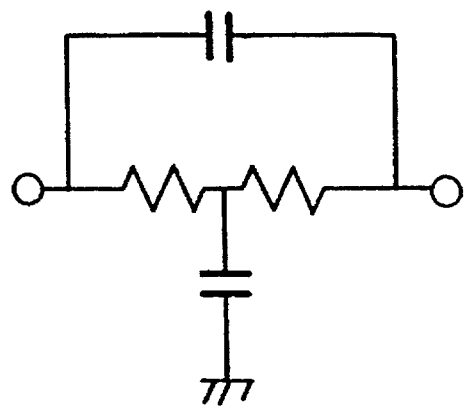
FIGS. 1A and 1B are schematic diagrams showing conventional bridge T type circuits.
Figure 1B:
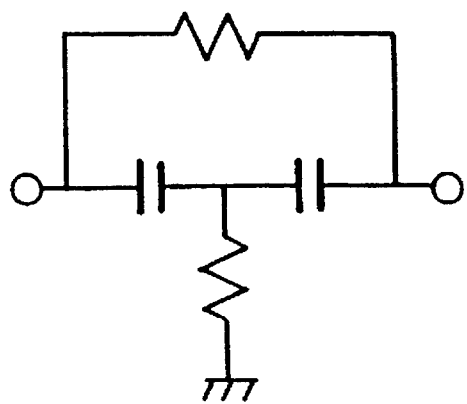
Figure 2:
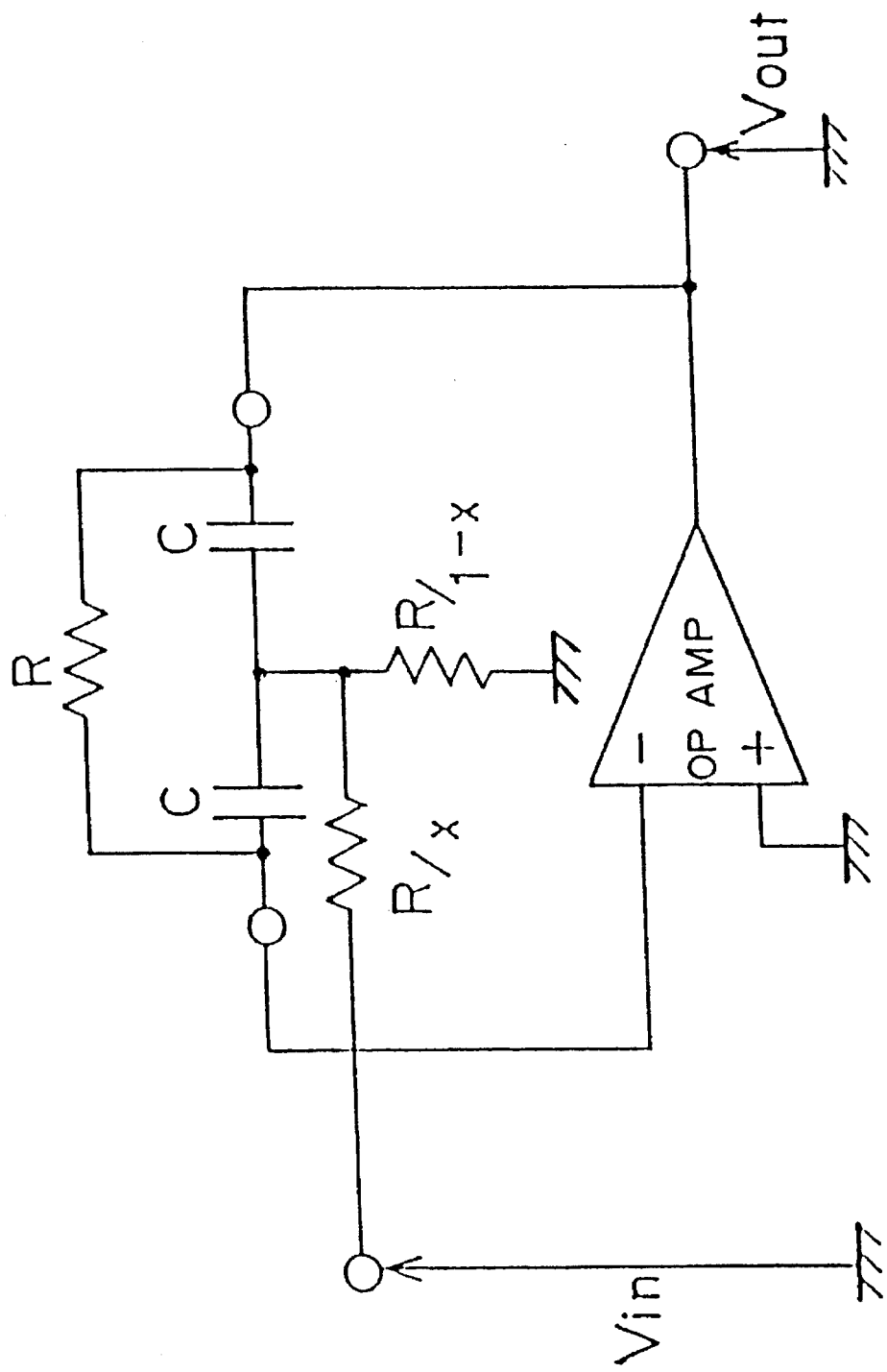
FIG. 2 is a schematic diagram showing a circuit of a conventional band-pass filter using an OP amplifier.
Figure 3:
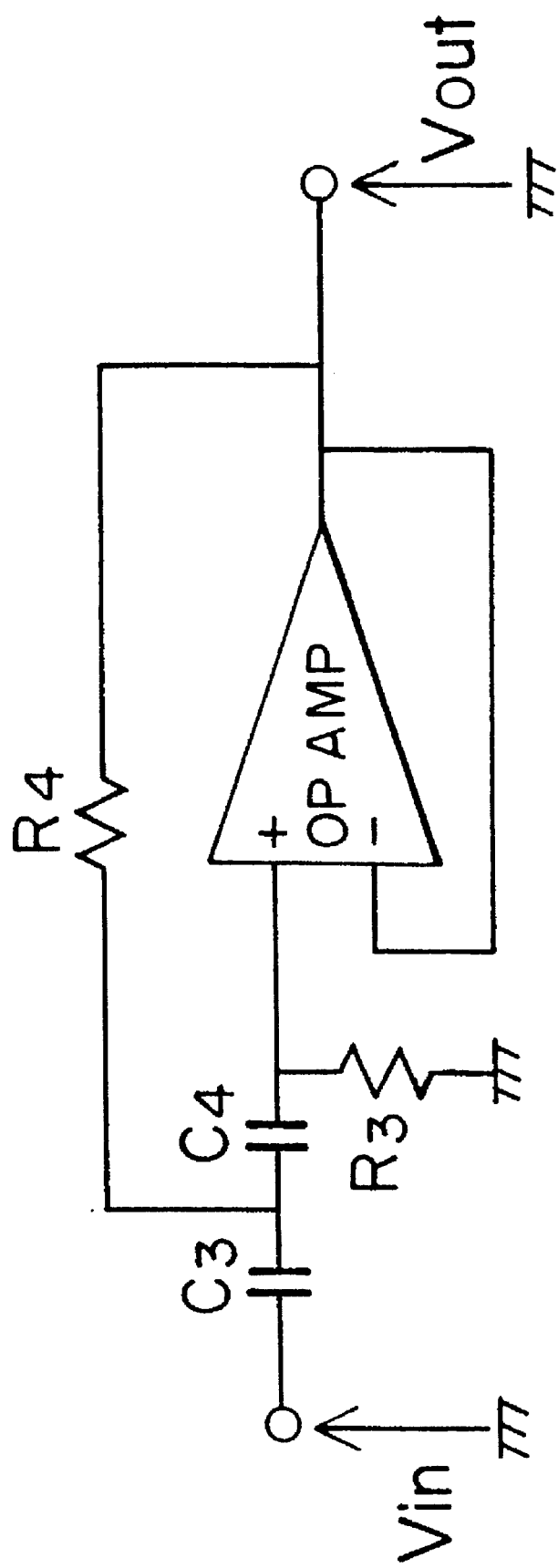
FIG. 3 is a schematic diagram showing a circuit of a conventional active high-pass filter.
Figure 4:
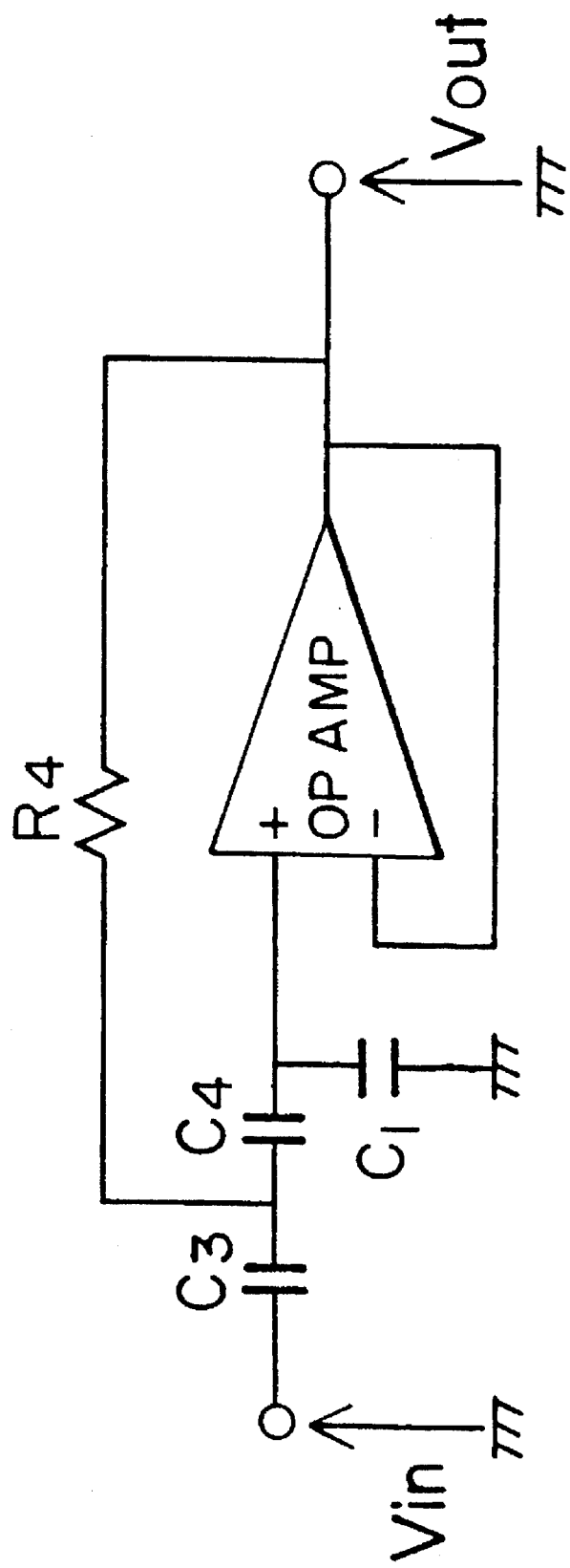
FIG. 4 is a schematic diagram showing a circuit of a conventional active low-pass filter.
Figure 5:
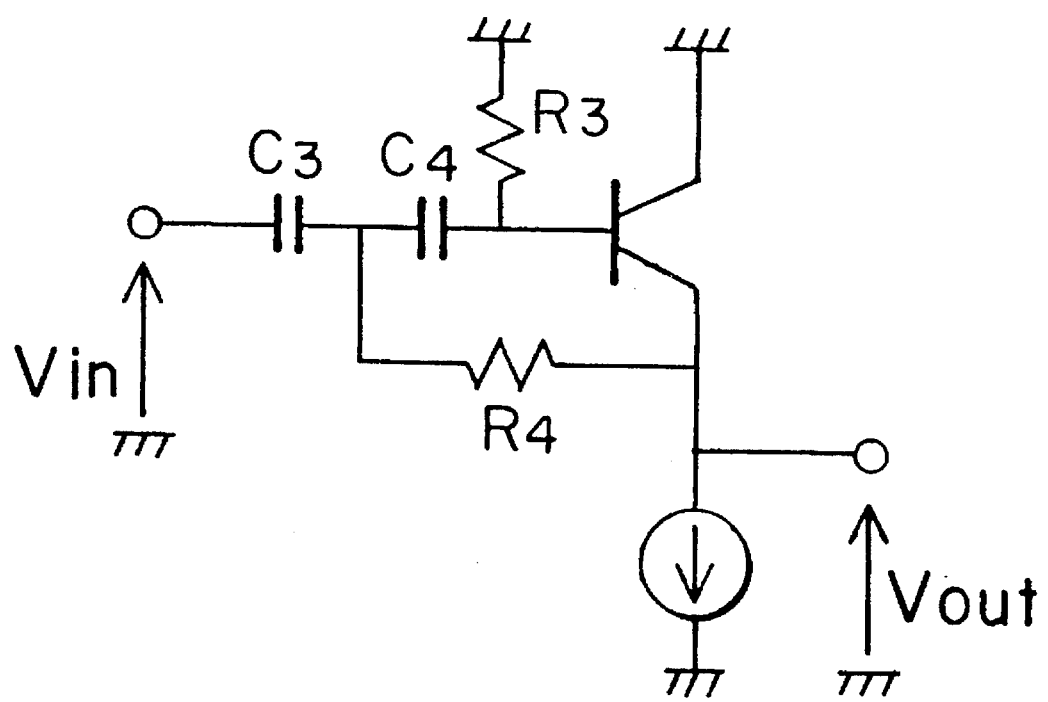
FIG. 5 is a schematic diagram showing a circuit of a conventional active high-pass filter using an emitter follower.
Figure 6:
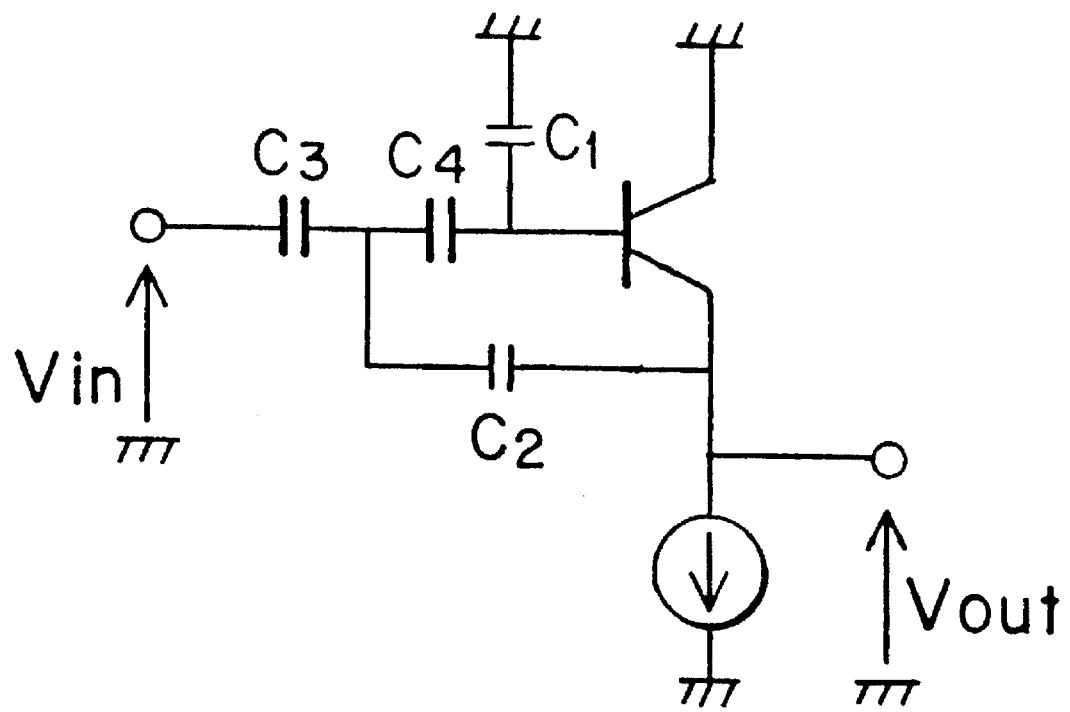
FIG. 6 is a schematic diagram showing a circuit of conventional active low-pass filter using an emitter follower.
Figure 7:
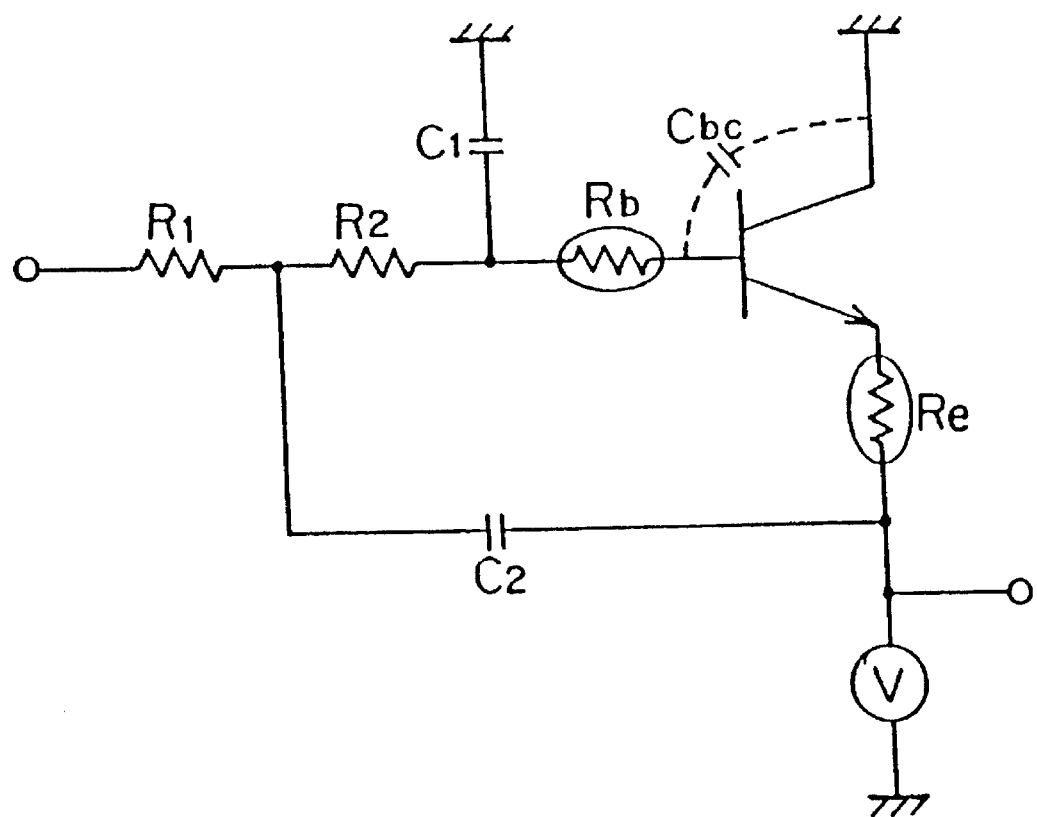
FIG. 7 is a schematic diagram showing an equivalent circuit of a conventional low-pass filter.
Figure 9:
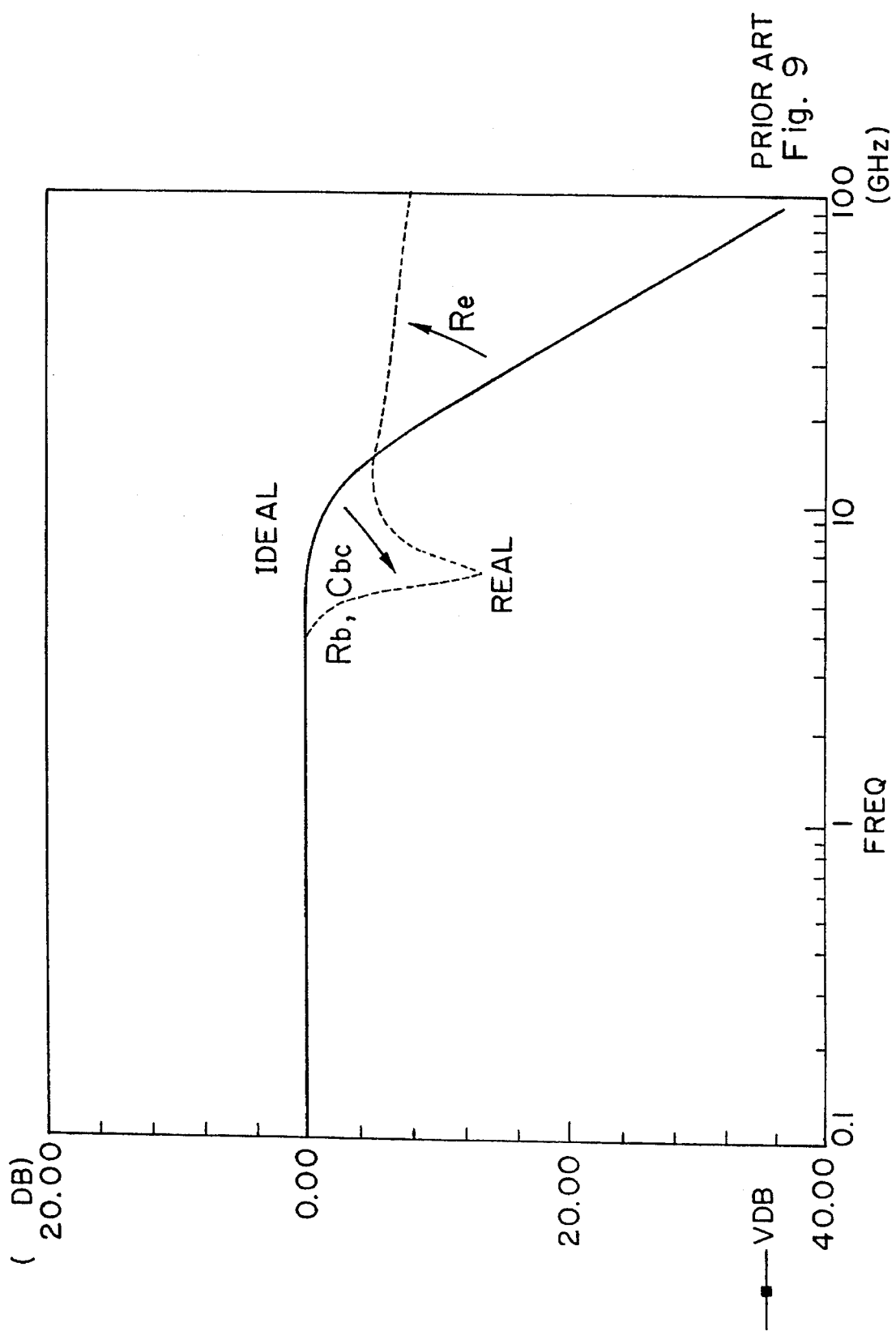
FIG. 9 is graph showing a frequency characteristic of a conventional low-pass filter.
Figure 15:
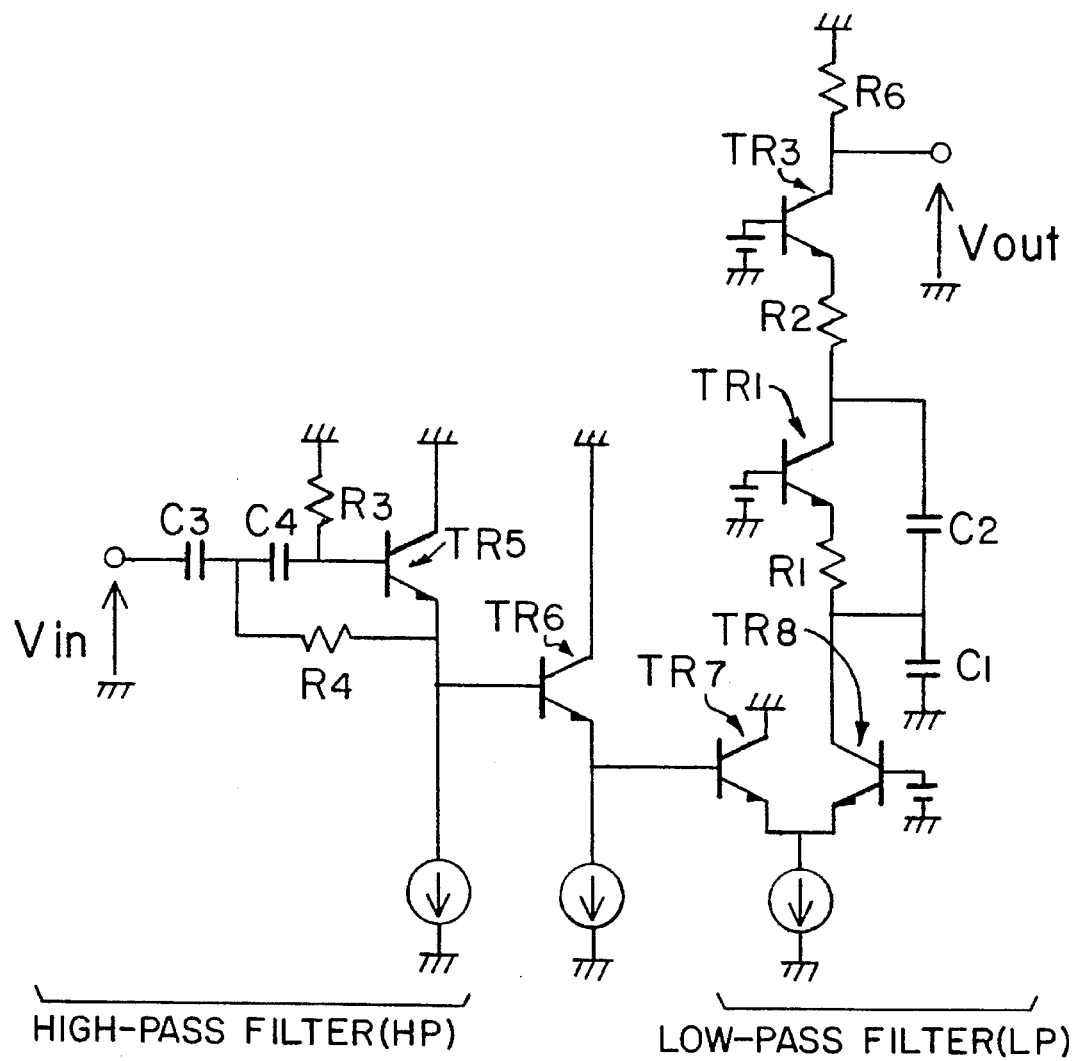
FIG. 15 is a circuit diagram showing a circuit of a band-pass filter of a forth embodiment.
Figure 15A:
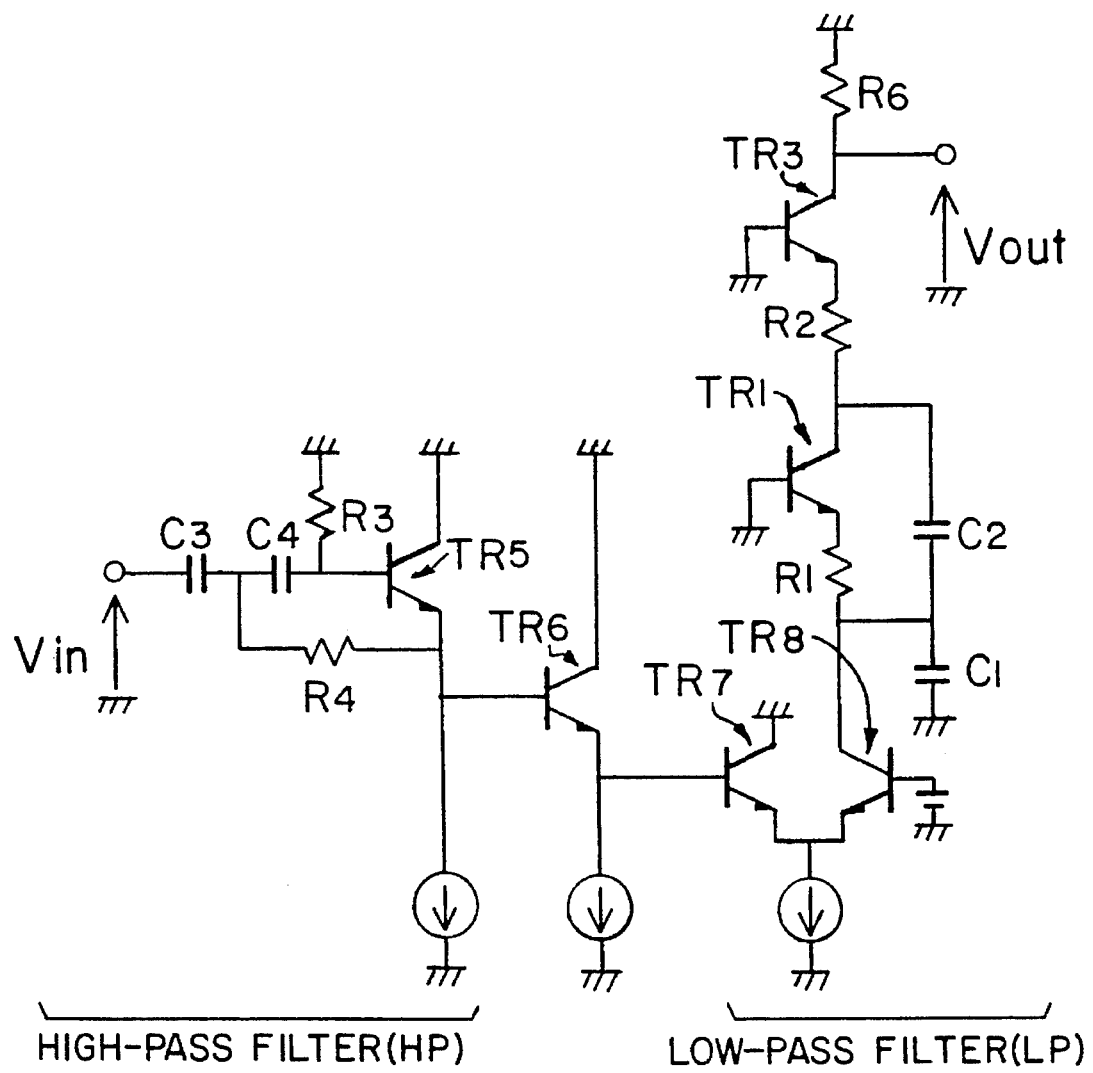
FIG. 15a is a circuit diagram showing a band-pass filter of FIG. 15 in which a low-pass filter has grounded-base transistors of the embodiment of FIG. 10.

The construction of the high-pass filter HP of FIG. 15 is basically the same as that of the conventional high-pass filter using the emitter follower circuit of FIG. 5. On the other hand, the construction of the low-pass filter LP is basically the same as that of the low-pass filter of FIG. 13. However, in the band-pass filter shown in FIG. 15, resistors $R_1$ and $R_2$ are used instead of the emitter resistance $R_e$ and the diode $D_1$ of the low-pass filter of FIG. 13. Thus, the cutoff frequency of the band-pass filter is fixed.

The output signal voltage of the high-pass filter HP of FIG. 15 is input to the base of an emitter follower transistor $TR_6$. The impedance of both the HP circuit and LP circuit is converted by the transistor $TR_6$. The resultant signal is input to the base of a transistor $TR_7$ which constructs a differential amplifying circuit. The collector of the transistor $TR_7$ is grounded. The emitter of the transistor $TR_7$ is connected to a current source which is common with the emitter of the transistor $TR_8$.

The collector of the transistor $TR_8$ of the differential amplifying circuit is connected to an input of the low-pass filter LP. A resistor $R_6$ is connected between the collector of the transistor $TR_3$ and the ground surface. The collector of the transistor $TR_3$ is an output of the low-pass filter.

In this band-pass filter, frequency components of an input signal $V_{in}$ which are power than the cutoff frequency of the high-pass filter HP are cut. A voltage signal which passes through the high-pass filter HP is sent to the differential amplifying circuit constructed of the transistors $TR_7$ and $TR_8$ through the emitter follower circuit constructed of the transistor TR6. The differential amplifying circuit converts the voltage signal into a current signal. The resultant current signal is sent to the low-pass filter LP constructed of a common-base transistor. The low-pass filter cuts frequency components higher than the cutoff frequency. Thus, the resultant signal is output from an output resistor $R_6$ as an output signal $V_{out}$.

With a low-pass filter using a common-base transistor, a band-pass filter which operates in a high frequency band of several gigahertz [GHz] or higher and suppresses the influence of the inner resistance and capacitance of the transistor can be constructed.

In addition, a low-pass filter can be constructed by using first and second diodes instead of the resistors $R_1$ and $R_2$ of the low-pass filter LP of the band-pass filter of FIG. 15 and connecting a variable current source between the input signal source and the reference voltage point. In this case, by varying the output current of the variable current source, the values of the resistance of the first and second diodes can be controlled so as to adjust the cutoff frequency of the low-pass filter. As a result, a filter which has a desired frequency characteristic and which can compensate for the deviation of the frequency characteristic which takes place in the IC device production stage can be constructed.

It should be noted that the circuit which converts a voltage signal of the high-pass filter into a current signal is not limited to a differential amplifying circuit, but other circuits may be used. In addition, the present invention can be applied to a band-stop filter which stops frequency components in a predetermined frequency band.

Next, with reference to FIG. 16, a high-pass filter of a fifth embodiment in accordance with the present invention will be described. In the high-pass filter shown in the figure, an emitter follower circuit is used so as to control the cutoff frequency.

Figure 16:
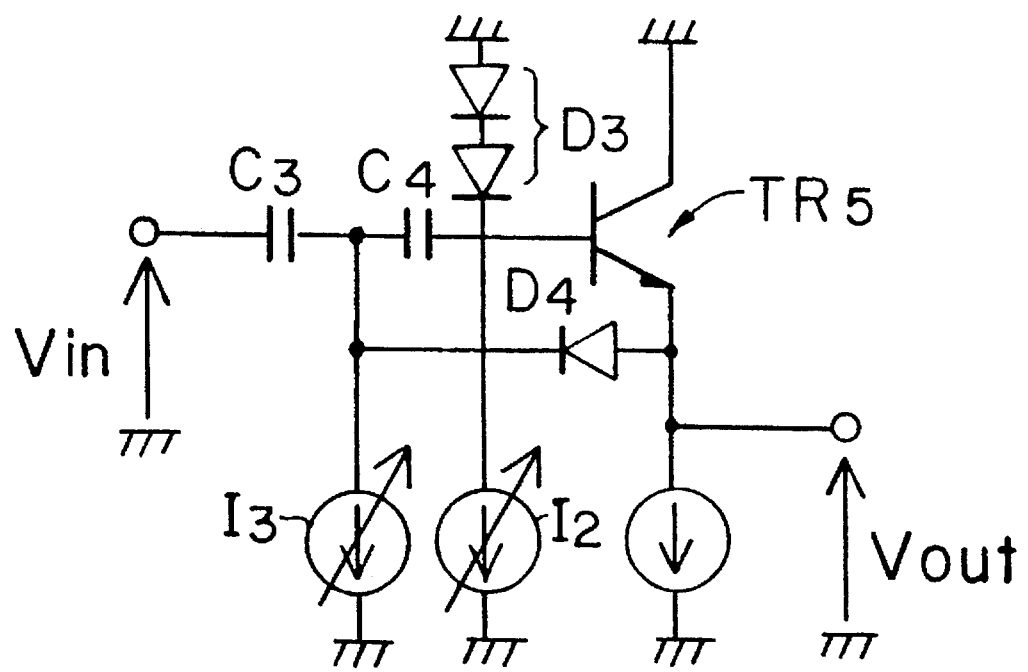
FIG. 16 is a circuit diagram showing a circuit of a high-pass filter of a fifth embodiment.

In the high-pass filter shown in FIG. 16, diodes $D_3$ and $D_4$ are used instead of the resistors $R_3$ and $R_4$ of the conventional high-pass filter shown in FIG. 5. A variable DC current source $I_2$ is connected to the cathode of the diode $D_3$. In addition, a variable DC current source $I_3$ is connected to the cathode of the diode $D_4$. In this high-pass filter, by varying the output currents of the variable DC current sources $I_2$ and $I_3$, the values of the resistance of the diodes $D_3$ and $D_4$ are varied so as to freely control the cutoff frequency of the filter.

Figure 17:
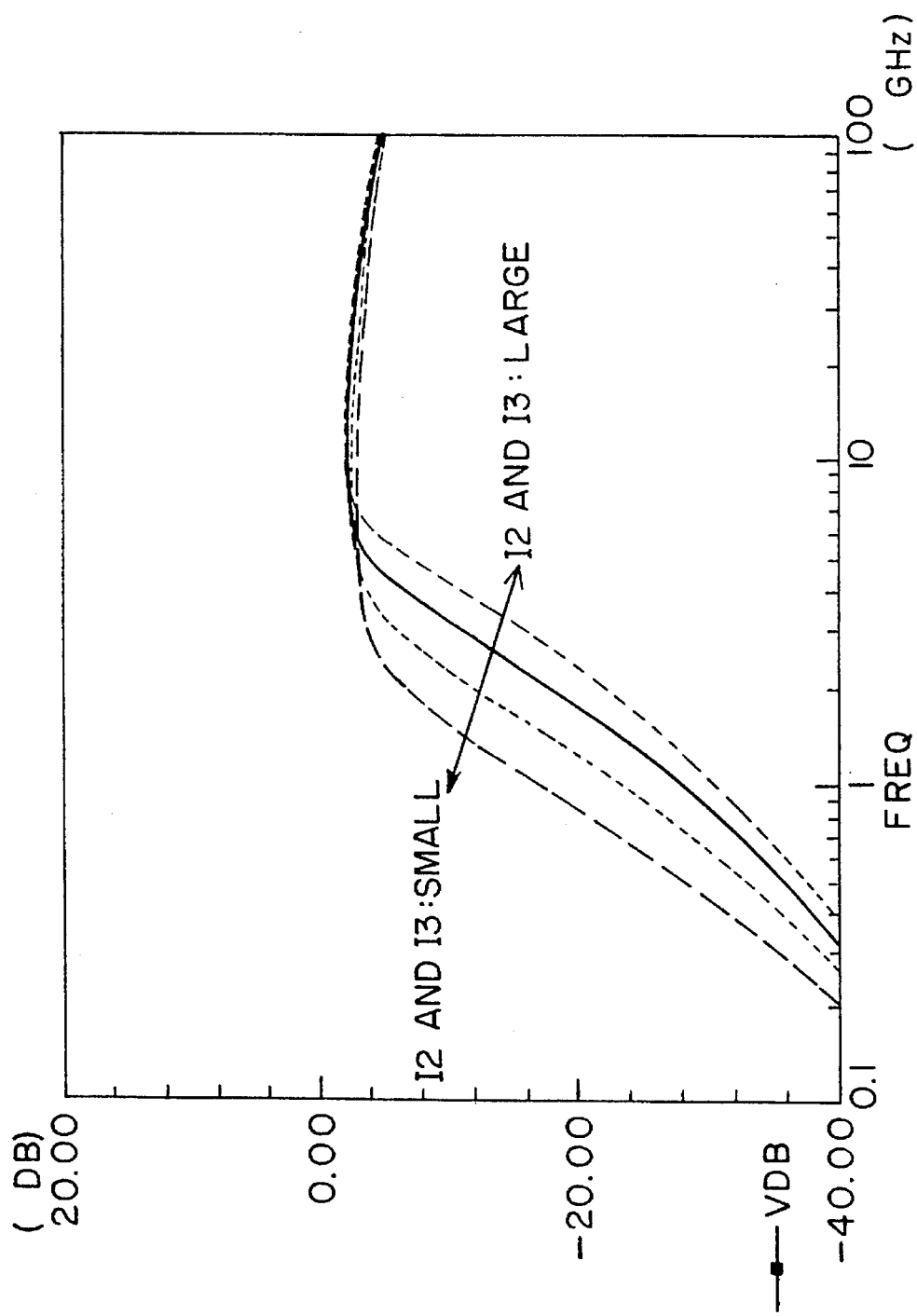
FIG. 17 is a graph showing a frequency characteristic of the high-pass filter of the fifth embodiment.

FIG. 17 is a graph showing an example of measured values of a frequency characteristic of the above-mentioned high-pass filter. The four dot lines of the graph represent cutoff characteristics of the filter when the output currents of the variable DC current sources $I_2$ and $I_3$ are varied. Thus, by varying the output currents of the variable DC current sources $I_2$ and $I_3$, the cutoff frequency can be freely controlled.

In addition, a band-pass filter can be also constructed by combining the high-pass filter of the fifth embodiment which can variably control the cutoff frequency and the low-pass filter of the third embodiment which can also variably control the cutoff frequency or a low-pass filter with a fixed cutoff frequency where the diode of the third embodiment is replaced with a resistor.

Figure 18:
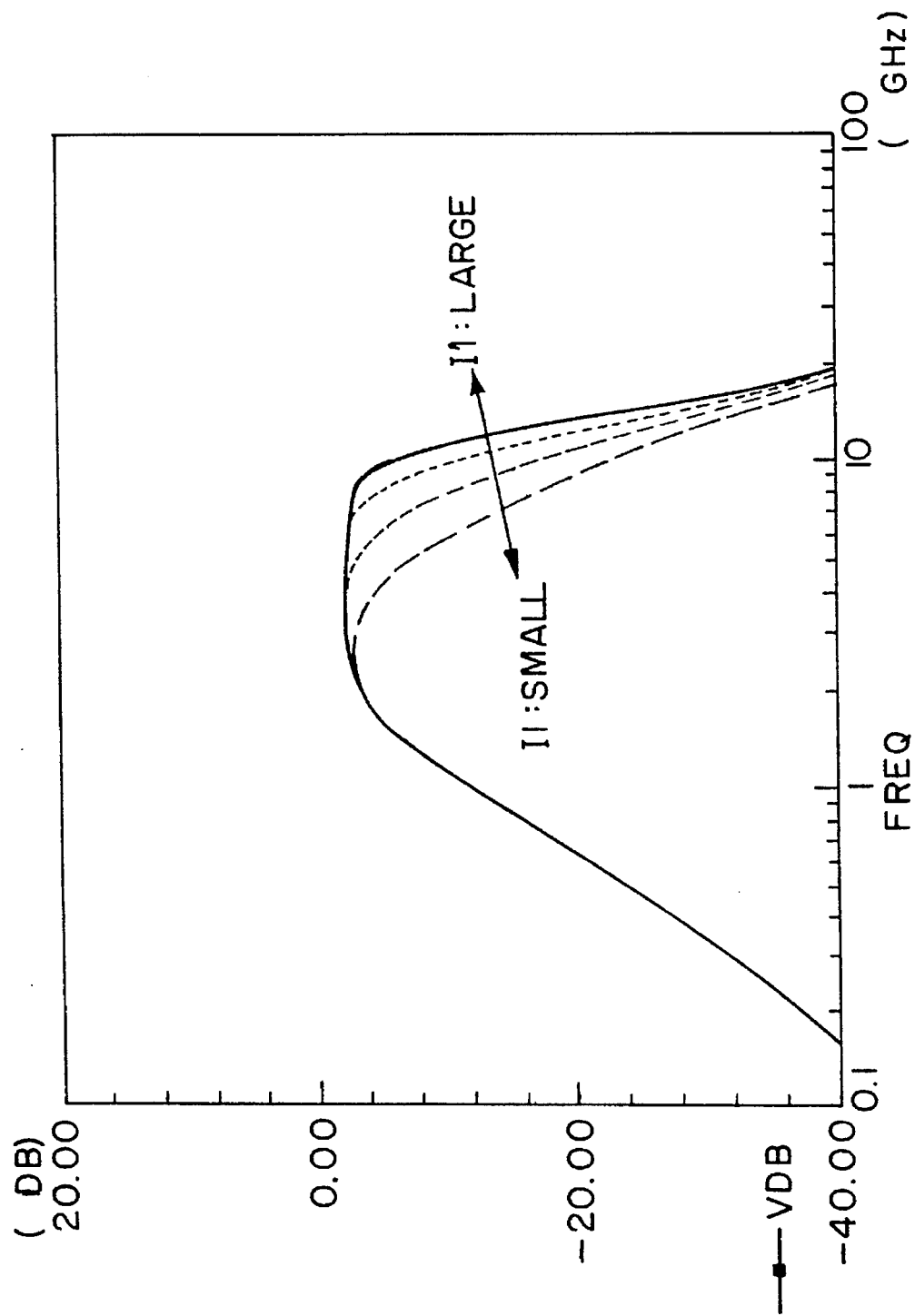
FIG. 18 is a graph showing a frequency characteristic of a band-pass filter with a low-pass side control.
Figure 19:
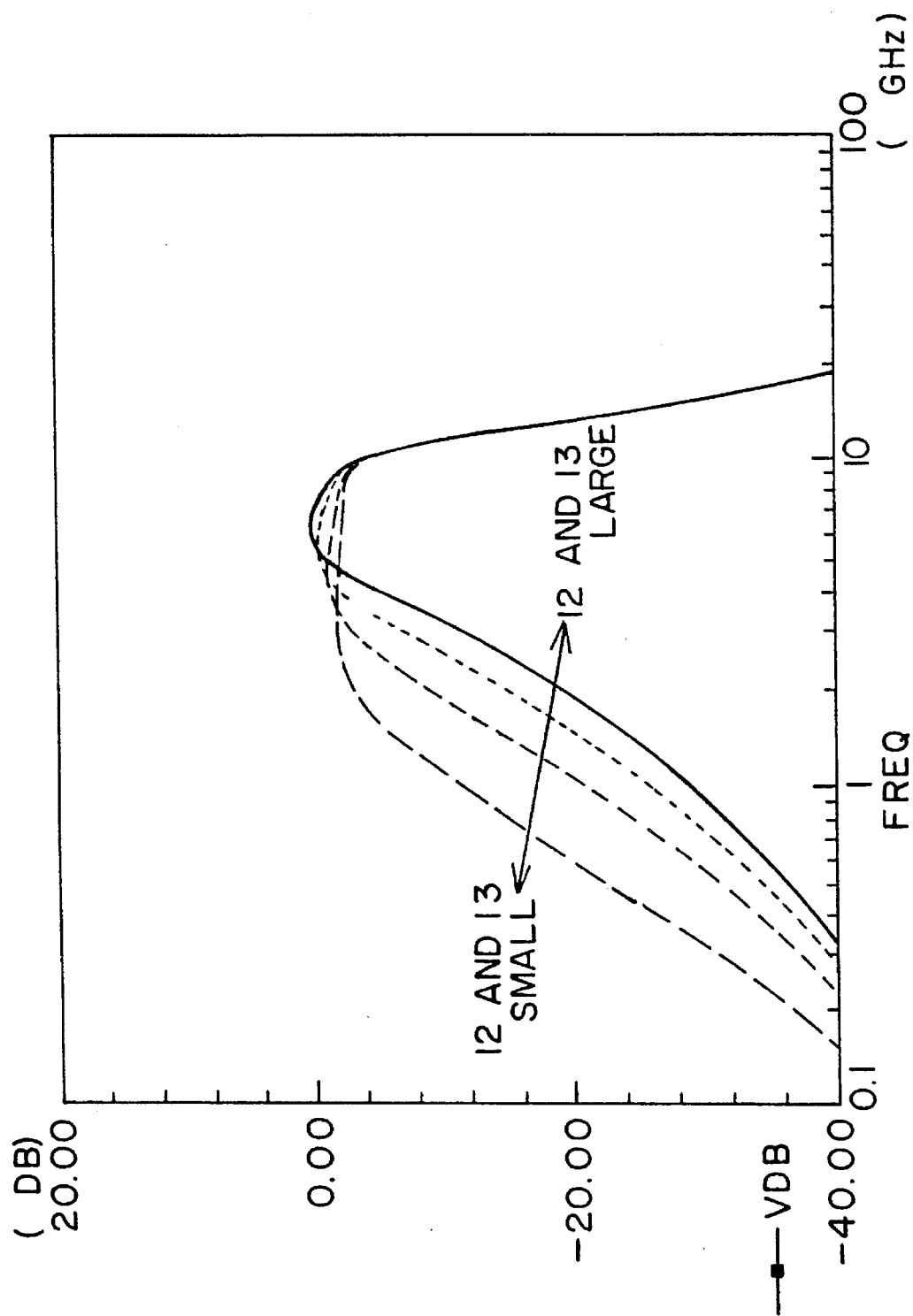
FIG. 19 is a graph showing a frequency characteristic of the band-pass filter with a high-pass side control.

FIGS. 18 and 19 are graphs showing frequency characteristics of a band-pass filter where the high-pass filter of the fifth embodiment which can variably control the cutoff frequency and the low-pass filter of the third embodiment which can variably control the cutoff frequency are combined.

FIG. 18 is a graph showing simulated values of the frequency characteristic of the above-mentioned band-pass filter with the low-pass side control. The four dot lines of the graph represent cutoff characteristics of the filter when the output current of the DC current source is varied.

Likewise, FIG. 19 is a graph showing simulated values of the frequency characteristic of the above-mentioned band-pass filter with the high-pass side control. The four dot lines of the graph represent the cutoff characteristics of the filter when the output current of the DC current source is varied.

When a band-pass filter is constructed of the high-pass filter and the low-pass filter which can both control the cutoff frequency, the band-pass filter can operate in a high frequency band and freely control the high-band and low-band cutoff frequencies.

According to the present invention, when a filter is constructed by using a common-base transistor, a low-pass filter, a band-pass filter, and so forth which operate in a high frequency band of several gigahertz [GHz] or higher with suppression of the influence of inner stray capacitance of the transistor can be constructed. In addition, by using a diode instead of a resistor in a high-pass filter using an emitter follower circuit, the current which flows through the diode can be varied and thereby the frequency characteristic of the high-pass filter can be freely controlled.

Although the present invention has been shown and described with respect to a best mode embodiment thereof, it should be understood by those skilled in the art that the foregoing and various other changes, omissions, and additions in the form and detail thereof may be made therein without departing form the spirit and scope of the present invention.

What is claimed is:

1. A filter circuit comprising:

a first grounded-base transistor receiving an input signal at an emitter thereof and outputting an output signal from a collector thereof;

a first capacitor connected between said emitter of said first grounded-base transistor and a reference voltage point; and a second capacitor connected between said emitter and said collector of said first grounded-base transistor.

2. The filter circuit according to claim 1, and further comprising:

a high-pass filter connected in series to said first grounded-base transistor and providing said input signal therefor and including:

an emitter follower transistor, third and fourth capacitors serially connected to each other, one of said third and fourth capacitors receiving an input voltage and another of said third and fourth capacitors being connected to a base of said emitter follower transistor, and a resistor connected between an emitter of said emitter follower transistor and a connection point of said third and fourth capacitors.

3. The filter circuit according to claim 1, and further comprising:

a first resistor connected to the emitter of said first grounded-base transistor, wherein said second capacitor is connected between the collector of said first grounded-base transistor and one end of said first resistor; and a high-pass filter connected in series to said first grounded-base transistor and providing said input signal and including:

an emitter follower transistor, third and fourth capacitors connected in series, one of said third and fourth capacitors receiving an input voltage and another of said third and fourth capacitors being connected to a base of said emitter follower transistor, and a second resistor connected between an emitter of said emitter follower transistor and a connection point of said third and fourth capacitors.

4. The filter circuit according to claim 1, and further comprising:

a first resistor connected to the emitter of said first grounded-base transistor, wherein said second capacitor is connected between the collector of said first grounded-base transistor and one end of said first resistor; and a high-pass filter connected in series to said first grounded-base transistor and providing said input signal therefor and including:

an emitter follower transistor, third and fourth capacitors connected in series, one of said third and fourth capacitors receiving an input voltage and another of said third and fourth capacitors being connected to a base of said emitter follower transistor, a first diode connected between said base of said emitter follower transistor and a reference voltage point, a second diode connected between an emitter of said emitter follower transistor and a connection point of said third and fourth capacitors, a first variable current source connected between a cathode of said first diode and the reference voltage point, and a second variable current source connected between a cathode of said second diode and the reference voltage point.

5. The filter circuit according to claim 1, and further comprising:

a first emitter follower transmitter having an emitter connected to an output terminal and a base which is connected to the collector of said first grounded-base transistor, wherein said second capacitor is connected between the emitter of said first grounded-base transistor and an emitter of said first emitter follower transistor.

6. The filter circuit according to claim 5, and further comprising:

a high-pass filter connected in series to said first grounded-base transistor and providing said input signal therefor and including:

a second emitter follower transistor, third and fourth capacitors connected in series between a voltage and a base of said second emitter follower transistor, and a resistor connected between an emitter of said second emitter follower transistor and a connection point of said third and fourth capacitors.

7. The filter circuit according to claim 5, and further comprising:

a first resistor receiving said input signal at one end thereof and being connected at another end thereof to the emitter of said first grounded-base transistor, wherein said first capacitor is connected between said one end of said first resistor and said reference voltage point; and said second capacitor is connected between the emitter of said first emitter follower transistor and said one end of said first resistor.

8. The filter circuit according to claim 5, and further comprising:

first and second resistors connected in series between an input terminal and the emitter of said first grounded-base transistor, wherein said first capacitor is connected between a connection point of said first and second resistors and said reference voltage point; and said second capacitor is connected between said input terminal and the emitter of said first emitter follower transistor.

9. The filter circuit according to claim 1, and further comprising:

a second grounded-base transistor having an emitter which is connected to the collector of said first grounded-base transistor and a collector connected to an output terminal.

10. The filter circuit according to claim 9, and further comprising:

a high-path filter connected in series to said first and second grounded-base transistors and providing said input signal and including:

an emitter follower transistor, third and fourth capacitors connected in series, one of said third and fourth capacitors receiving an input voltage and another of said third and fourth capacitors being connected to a base of said emitter follower transistor, and a resistor connected between an emitter of said emitter follower transistor and a connection point of said third and fourth capacitors.

11. The filter circuit according to claim 9, and further comprising:

a first resistor connected between an input terminal and the emitter of said first grounded-base transistor;

a second resistor connected between the collector of said first grounded-base transistor and the emitter of said second grounded-base transistor, wherein said first capacitor is connected between the input terminal of said first resistor and a reference voltage point; and said second capacitor is connected between the collector of said second grounded-base transistor and the input terminal of said first resistor.

12. The filter circuit according to claim 11, wherein the resistance value of said second resistor is set to be a value such that the composite impedance of said first grounded-base transistor due to a base resistance thereof and base-collector capacitance can be negligible in a high frequency band.

13. The filter circuit according to claim 11, and further comprising:

a high-pass filter connected in series to said first and second grounded-base transistors and providing said input signal and including:

an emitter follower transistor, third and fourth capacitors connected in series, one of said third and fourth capacitors receiving an input voltage and another of said third and fourth capacitors being connected to a base of said emitter follower transistor, and a resistor connected between an emitter of said emitter follower transistor and a connection point of said third and fourth capacitors.

14. The filter circuit according to claim 11, further comprising:

a high-pass filter connected in series to said first and second grounded-base transistors and providing said input signal and including:

an emitter follower transistor, third and fourth capacitors connected in series, one of said third and fourth capacitors receiving an input voltage and another of said third and fourth capacitors being connected to a base of said emitter follower transistor, a first diode connected between the base of said emitter follower transistor and a reference voltage point, a second diode connected between an emitter of said emitter follower transistor and a connection point of said third and fourth capacitors, a first variable current source connected between a cathode of said first diode and the reference voltage point, and a second variable current source connected between a cathode of said second diode and the reference voltage point.

15. The filter circuit according to claim 9, further comprising:

a first diode connected between the collector of said first grounded-base transistor and the emitter of said second grounded-base transistor; and a first variable current source connected in parallel to said first capacitor, wherein a cutoff frequency of the filter is adjusted by controlling an output current of the first variable current source.

16. The filter circuit according to claim 15, wherein the resistance value of said first diode is set by controlling the output current from said first variable current source, and thus the composite impedance of said first grounded-base transistor due to a base resistance thereof and base-collector capacitance can be negligible.

17. The filter circuit according to claim 15, further comprising:

a high-pass filter connected in series to said first and second grounded-base transistors and providing said input signal and including:

an emitter follower transistor, third and fourth capacitors connected in series, one of said third and fourth transistors receiving an input voltage and another of said third and fourth transistors being connected to a base of said emitter follower transistor, and a resistor connected between an emitter of said emitter follower transistor and a connection point of said third and fourth capacitors.

18. The filter circuit according to claim 15, further comprising:

a high-pass filter connected in series to said first and second grounded-base transistors and providing said input signal and including:

an emitter follower transistor, third and fourth capacitors connected in series, one of said third and fourth capacitors receiving an input voltage and another of said third and fourth capacitors being connected to a base of said emitter follower transistor, and a second diode connected between the base of said emitter follower transistor and the reference voltage point, a third diode connected between an emitter of said emitter follower transistor and a connection point of said third and fourth capacitors, a second variable current source connected between a cathode of said second diode and the reference voltage point, and a third variable current source connected between a cathode of said third diode and the reference voltage point.

19. The filter circuit according to claim 9, further comprising:

a first diode connected between an input terminal and the emitter of said first grounded-base transistor;

a second diode connected between the collector of said first grounded-base transistor and an emitter of said second grounded-base transistor; and a first variable current source connected between said first grounded-base transistor and a reference electric potential, wherein a cutoff frequency of the filter is adjusted by controlling an output current of the first variable current source.

20. The filter circuit according to claim 19, further comprising:

a high-pass filter connected in series to said first and second grounded-base transistors and providing said input signal and including:

an emitter follower transistor, third and fourth capacitors serially connected to each other, said third transistor receiving an input voltage and said fourth transistor being connected to a base of said emitter follower transistor, and a resistor connected between an emitter of said emitter follower transistor and a connection point of said third and fourth capacitors.

21. The filter circuit according to claim 19, and further comprising:

a high-pass filter connected in series to said first and second grounded-base transistors and providing said input signal and including:

an emitter follower transistor, third and fourth capacitors connected to a base of said emitter follower transistor, a third diode connected between the base of said emitter follower transistor and a reference voltage point, a fourth diode connected between an emitter of said emitter follower transistor and a connection point of said third and fourth capacitors, a second variable current source connected between a cathode of said third diode and the reference voltage point; and a third variable current source connected between a cathode of said fourth diode and the reference voltage point.

22. A filter circuit comprising:

a first grounded-base transistor;

a first resistor having one end connected to an input terminal and another end connected to an emitter of said first grounded-base transistor, said first grounded-base transistor outputting a signal at an collector thereof;

a first capacitor connected between said first resistor and a reference electric potential; and a second capacitor connected between the collector of said first grounded-base transistor and an input line of said first resistor.

23. A filter circuit comprising:

a first grounded-base transistor for receiving an input signal at an emitter thereof, and outputting a signal from a collector thereof;

a first capacitor connected between said emitter receiving the input signal, and a reference electric potential;

an emitter follower transistor having a base connected to said collector outputting the signal, and an emitter connected to an output terminal; and a second capacitor connected between said emitter receiving the input signal and the emitter of said emitter follower transistor.

* * * * *